United States Patent
Roy

(10) Patent No.: US 9,941,200 B1
(45) Date of Patent: Apr. 10, 2018

(54) CONTACT TRENCH BETWEEN STACKED SEMICONDUCTOR SUBSTRATES

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/275,619

(22) Filed: Sep. 26, 2016

(51) Int. Cl.
*H01L 23/52* (2006.01)
*H01L 25/065* (2006.01)
*H01L 23/522* (2006.01)

(52) U.S. Cl.
CPC ...... *H01L 23/5226* (2013.01); *H01L 25/0657* (2013.01)

(58) Field of Classification Search
CPC ............. H01L 23/5226; H01L 25/0657; H01L 29/7869; H01L 2924/00; H01L 27/1207; H01L 27/0688; H01L 27/0922; H01L 27/0924; H01L 27/105; H01L 27/1251; H01L 29/7833; H01L 27/3276; H01L 29/0847; H01L 23/535; H01L 27/0886; H01L 27/14636; H01L 29/7827; H01L 27/10826
USPC ........................................................ 257/401
See application file for complete search history.

(56) References Cited

U.S. PATENT DOCUMENTS

| | | |
|---|---|---|
| 5,480,837 A | 1/1996 | Liaw et al. |
| 8,513,761 B2 | 8/2013 | Roy et al. |
| 2006/0234487 A1* | 10/2006 | Kim ................ H01L 21/28518 438/597 |
| 2007/0018075 A1 | 1/2007 | Cazaux et al. |
| 2008/0185648 A1* | 8/2008 | Jeong ................ H01L 21/8221 257/347 |
| 2012/0199882 A1 | 8/2012 | Shin |
| 2013/0248953 A1 | 9/2013 | Endo et al. |
| 2015/0236058 A1 | 8/2015 | Hu et al. |
| 2015/0311142 A1 | 10/2015 | Sekar et al. |
| 2016/0181155 A1 | 6/2016 | Deprat et al. |

\* cited by examiner

*Primary Examiner* — Caleen Sullivan
(74) *Attorney, Agent, or Firm* — Gardere Wynne Sewell LLP

(57) ABSTRACT

A first semiconductor substrate layer supports a first transistor including a first source-drain formed by a doped region of the substrate layer. A second semiconductor substrate layer supports a second transistor including a second source-drain formed by a doped region of the substrate layer. The second semiconductor substrate layer is stacked over the first semiconductor substrate layer and separated therefrom by an insulating layer. A metal wiring extends from an electrical contact with the doped region for the first source-drain, through the insulating layer and passing through an electrical isolation structure in the second semiconductor substrate layer to make an electrical contact with the doped region for the second source-drain. The electrical isolation structure is formed by one of a trench isolation or the doped region of the second source-drain itself. The isolation structure has a thickness equal to a thickness of the second semiconductor substrate layer.

17 Claims, 2 Drawing Sheets

CONTACT TRENCH BETWEEN STACKED SEMICONDUCTOR SUBSTRATES

TECHNICAL FIELD

The present invention relates to integrated circuit devices formed by two or more stacked semiconductor substrates and, in particular, to a trench contact for electrically interconnecting doped regions within two or more stacked semiconductor substrates.

BACKGROUND

It is known in the art to form integrated circuit devices utilizing two or more stacked semiconductor substrates. In such devices, metal wiring is provided to electrically interconnect circuits supported on and in one of the substrates with circuits supported on and in another of the substrates. These metal wirings occupy space in the layout of the device and this can present a problem with circuits that are arranged in an array format. An array of image pixel circuits is an example of such an integrated circuit device. Space must be provided in the layout to accommodate the metal wirings that pass between the stacked substrate for each circuit element of the array. This has an adverse effect on efforts to minimize pixel pitch distance.

SUMMARY OF THE INVENTION

It is to be understood that both the foregoing general description and the following detailed description are exemplary and explanatory and are intended to provide further explanation of the invention as claimed.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; and a first metal wiring extending from an electrical contact with the doped region for the first source-drain, through the intermediary insulating layer and passing through and in electrical contact with the doped region for the second source-drain.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; a trench isolation formed in second semiconductor substrate layer and having a thickness equal to a thickness of the second semiconductor substrate layer; and a first metal wiring extending from an electrical contact with the doped region for the first source-drain, through the intermediary insulating layer and passing through the trench isolation to make an electrical contact with the doped region for the second source-drain.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; and a first metal wiring extending from an electrical contact with the doped region for the first source-drain, through the intermediary insulating layer and passing through an electrical isolation structure in the second semiconductor substrate layer to make an electrical contact with the doped region for the second source-drain, said electrical isolation structure having a thickness equal to a thickness of the second semiconductor substrate layer.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
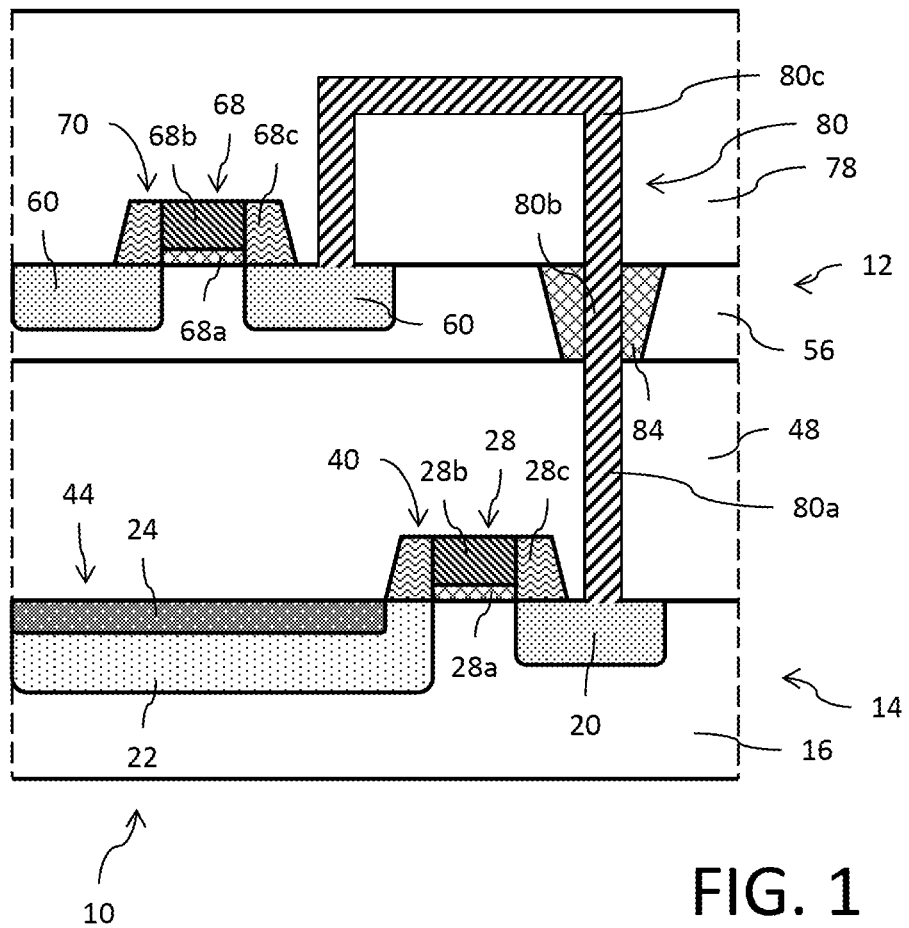
FIG. 1 is a cross-section of an integrated circuit device formed by stacking semiconductor substrates.

Reference is now made to FIG. 1 showing a cross-section of an integrated circuit device 10 formed by stacking an upper semiconductor substrate 12 over a lower semiconductor substrate 14. The device 10 in this example implementation is an image pixel circuit, but it will be understood that this is by way of example only and the technique disclosed herein for supporting the making of electrical contact between stacked semiconductor substrates is useful in many types of integrated circuit devices.

The lower semiconductor substrate 14 includes a semiconductor layer 16 that is, for example, lightly doped with a first conductivity type dopant. In an example, the first conductivity type dopant is a p-type dopant with a dopant concentration of $1 \times 10^{15}$ at/cm$^3$. A plurality of doped regions 20, 22, 24 are provided extending into the semiconductor layer 16 from its top surface. The doped region 20 is heavily doped with a second conductivity type dopant. In an example, the second conductivity type dopant is an n-type dopant with a dopant concentration of $8 \times 10^{19}$ at/cm$^3$. The doped region 22 is doped with the second conductivity type dopant, for example, with a dopant concentration of $2 \times 10^{16}$ at/cm$^3$. The doped region 24 is heavily doped with the first conductivity type dopant, for example, with a dopant concentration of $5 \times 10^{17}$ at/cm$^3$. A transistor gate structure 28 including a gate oxide layer 28a, a gate electrode 28b and sidewall spacers 28c is formed on the top surface of the semiconductor layer 16. For the integrated circuit shown, the doped regions 20 and 22 form source-drain regions for a transistor 40 having the transistor gate structure 28, and the doped regions 22 and 24 form the p-n junction of a photodiode 44. An intermediary insulating layer 48 is provided over the lower semiconductor substrate 14 and the transistor gate structure 28.

The upper semiconductor substrate 12 includes a semiconductor layer 56 that is, for example, lightly doped with the first conductivity type dopant with a dopant concentration of $1\times10^{15}$ at/cm$^3$. A bottom surface of the semiconductor layer 56 is mounted to an upper surface of the intermediary insulating layer 48. A plurality of doped regions 60 are provided extending into the semiconductor layer 56 from its top surface. The doped regions 60 are heavily doped with the second conductivity type dopant with a dopant concentration of $8\times10^{19}$ at/cm$^3$. A transistor gate structure 68 including a gate oxide layer 68a, a gate electrode 68b and sidewall spacers 68c is formed on the top surface of the semiconductor layer 56. For the integrated circuit shown, the doped regions 60 form source-drain regions for a transistor 70 having the transistor gate structure 68. An intermediary insulating layer 78 is provided over the upper semiconductor substrate 12 and the transistor gate structure 68.

A given integrated circuit may require the making of an electrical connection from one doped region in the semiconductor layer 16 of the lower semiconductor substrate 14 to another doped region in the semiconductor layer 56 of the upper semiconductor substrate 12. To provide that electrical connection, metal contacts, lines and vias are provided to define a conductive wiring 80 that includes a portion 80a that extends through the intermediary insulating layer 48, a portion 80b that extends through the semiconductor layer 56, and a portion 80c that extends through the intermediary insulating layer 78. When passing through the semiconductor layer 56, the portion 80b of conductive wiring 80 is insulated from the semiconductor layer 56 itself by a trench isolation structure 84 having a thickness equal to a thickness of the semiconductor layer 56 (for example, of the shallow trench type filled with an insulating oxide material). The portion 80a that extends through the intermediary insulating layer 48 makes electrical contact with a top surface of the doped region 20 for transistor 40. The portion 80c that extends through the intermediary insulating layer 78 makes electrical contact with a top surface of the doped region 60 for transistor 70.

Figure 2:
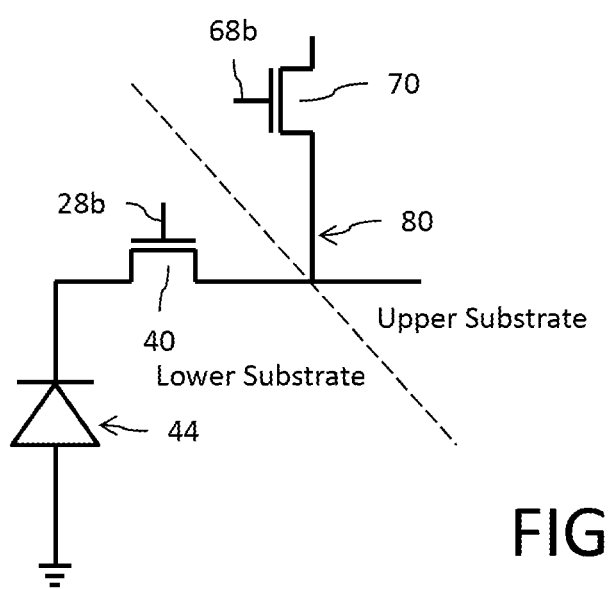
FIG. 2 is a schematic diagram of the integrated circuit device of FIG. 1.

FIG. 2 shows a schematic diagram of the integrated circuit device of FIG. 1. The cross-section of FIG. 1 does not show the full extent of the doped regions 22 and 24 for the photodiode 44. Only the structures for the transfer gate transistor 44 and reset transistor 70 are shown. Those skilled in the art understand that the read circuitry can include additional transistors connected in a known way. Those additional transistors, like with the transistor 70, are supported by the semiconductor layer 56 of the upper semiconductor substrate 12. The pixel of FIG. 1 is of the back-side illuminated type where light is received at the bottom surface of the lower semiconductor substrate 14.

Figure 3:
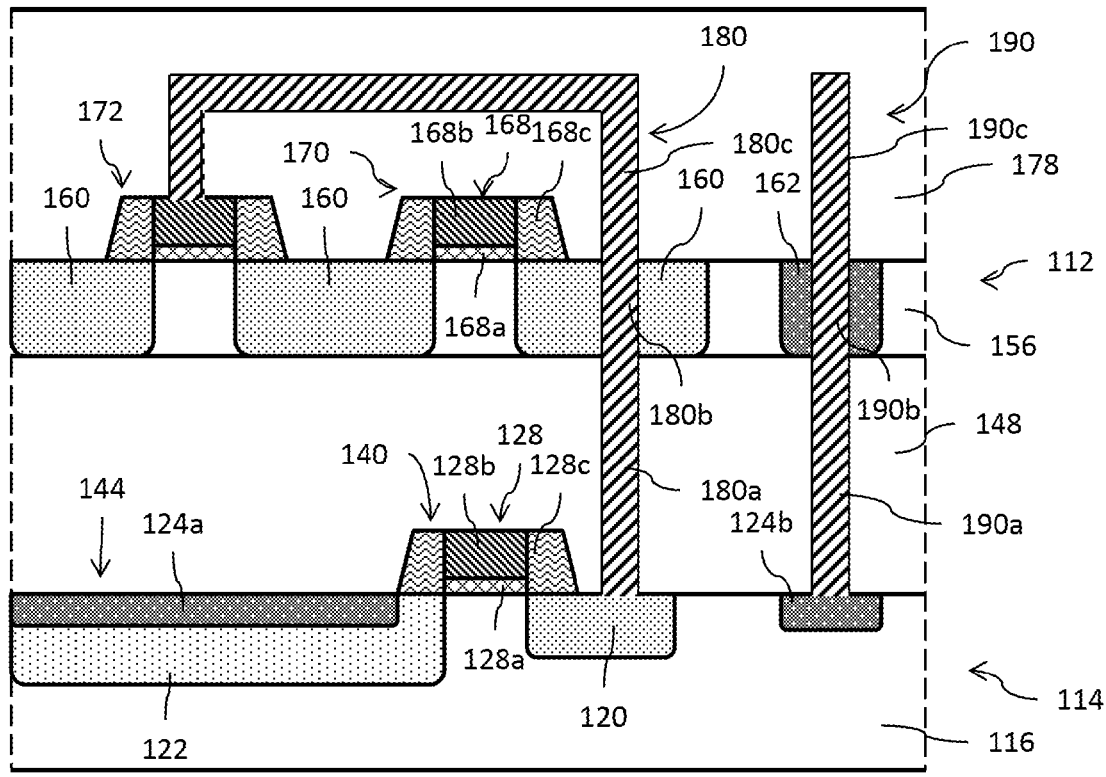
FIG. 3 is a cross-section of an integrated circuit device formed by stacking semiconductor substrates.

Reference is now made to FIG. 3 showing a cross-section of an integrated circuit device 110 formed by stacking an upper semiconductor substrate 112 over a lower semiconductor substrate 114. The device 110 in this example implementation is an image pixel circuit, but it will be understood that this is by way of example only and the technique disclosed herein for supporting the making of electrical contact between stacked semiconductor substrates is useful in many types of integrated circuit devices.

The lower semiconductor substrate 114 includes a semiconductor layer 116 that is, for example, lightly doped with a first conductivity type dopant. In an example, the first conductivity type dopant is a p-type dopant with a dopant concentration of $1\times10^{15}$ at/cm$^3$. A plurality of doped regions 120, 122 and 124a-124b are provided extending into the semiconductor layer 116 from its top surface. The doped region 120 is heavily doped with a second conductivity type dopant. In an example, the second conductivity type dopant is an n-type dopant with a dopant concentration of $8\times10^{19}$ at/cm$^3$. The doped region 122 is doped with the second conductivity type dopant, for example, with a dopant concentration of $2\times10^{16}$ at/cm$^3$. The doped regions 124a and 124b are heavily doped with the first conductivity type dopant, for example, with a dopant concentration of $5\times10^{17}$ at/cm$^3$ and $5\times10^{19}$ at/cm$^3$, respectively. A transistor gate structure 128 including a gate oxide layer 128a, a gate electrode 128b and sidewall spacers 128c is formed on the top surface of the semiconductor layer 116. For the integrated circuit shown, the doped regions 120 and 122 form source-drain regions for a transistor 140 having the transistor gate structure 128, and the doped regions 122 and 124a form the p-n junction of a photodiode 144. The doped region 124b provides a substrate contact region. An intermediary insulating layer 148 is provided over the lower semiconductor substrate 114 and the transistor gate structure 128.

The upper semiconductor substrate 112 includes a semiconductor layer 156 that is, for example, lightly doped with the first conductivity type dopant with a dopant concentration of $8\times10^{19}$ at/cm$^3$. A bottom surface of the semiconductor layer 156 is mounted to an upper surface of the intermediary insulating layer 148. A plurality of doped regions 160 are provided extending into the semiconductor layer 156 from its top surface and having a thickness equal to a thickness of the semiconductor layer 156. The doped regions 160 are heavily doped with the second conductivity type dopant with a dopant concentration of $8\times10^{19}$ at/cm$^3$. One or more doped regions 162 are provided extending into the semiconductor layer 156 from its top surface and having a thickness equal to a thickness of the semiconductor layer 156. The doped regions 162 are heavily doped with the first conductivity type dopant with a dopant concentration of $5\times10^{19}$ at/cm$^3$. A transistor gate structure 68 including a gate oxide layer 168a, a gate electrode 168b and sidewall spacers 168c is formed on the top surface of the semiconductor layer 156 for each of two supported transistors. For the integrated circuit shown, the doped regions 160 form source-drain regions for a first transistor 170 and a second transistor 172, with each transistor having the transistor gate structure 168. The doped region 162 provides a substrate contact region. An intermediary insulating layer 178 is provided over the upper semiconductor substrate 112 and the transistor gate structure 168.

A given integrated circuit may require the making of an electrical connection from one doped region in the semiconductor layer 116 of the lower semiconductor substrate 114 to another doped region in the semiconductor layer 156 of the upper semiconductor substrate 112. The given integrated circuit may further require the making of an electrical connection from one doped region to the gate electrode 168b of a transistor. To provide those electrical connections, metal contacts, lines and vias are provided to define a conductive wiring 180 that includes a portion 180a that extends through the intermediary insulating layer 148, a portion 180b that extends through the semiconductor layer 156, and a portion 180c that extends through the intermediary insulating layer 178. When passing through the semiconductor layer 156, the portion 180b of conductive wiring 180 passes through one of the doped regions 160 and is isolated from the semiconductor layer 156 by that doped region 160. The portion 180a that extends through the intermediary insulating layer 148 makes electrical contact with a top surface of the doped region 120 for transistor 140. The portion 180c that extends through the intermediary insulating layer 178 makes electrical contact with a top surface of the gate electrode 168b for transistor 172.

The given integrated circuit may additionally require the making of an electrical connection from the substrate contact doped region 124b for the semiconductor layer 116 of the lower semiconductor substrate 114 to the substrate contact doped region 162 for the semiconductor layer 156 of the upper semiconductor substrate 112. To provide that electrical connection, metal contacts, lines and vias are provided to define a conductive wiring 190 that includes a portion 190a that extends through the intermediary insulating layer 148, a portion 190b that extends through the semiconductor layer 156, and a portion 190c that extends through the intermediary insulating layer 178. When passing through the semiconductor layer 156, the portion 190b of conductive wiring 190 passes through the doped region 162. The portion 190a that extends through the intermediary insulating layer 198 makes electrical contact with a top surface of the doped region 124b. The portion 180c that extends through the intermediary insulating layer 178 may make electrical contact with a ground pin of the integrated circuit.

Although not shown in FIG. 1, it will be understood that the structures shown in FIG. 3 relating to the making of an electrical connection between substrate contact doped regions in the lower and upper semiconductor substrates are equally applicable to the implementation of FIG. 1. Furthermore, although not shown in FIG. 1, it will be understood that the structures shown in FIG. 3 relating to making contact with the gate electrode of a transistor are equally applicable to the implementation of FIG. 1.

Figure 4:
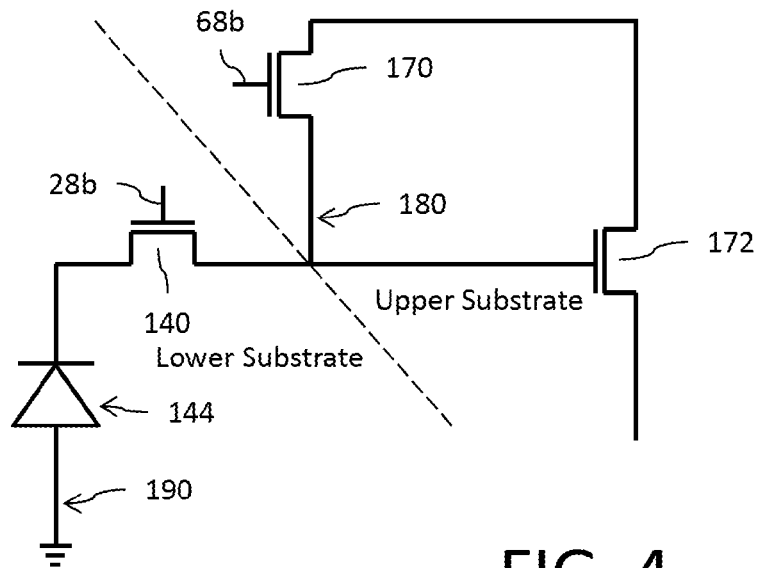
FIG. 4 is a schematic diagram of the integrated circuit device of FIG. 3.

FIG. 4 shows is a schematic diagram of the integrated circuit device of FIG. 3. The cross-section of FIG. 3 does not show the full extent of the doped regions 122 and 124a for the photodiode 144. Only the structures for the transfer gate transistor 144, reset transistor 170 and source-follower transistor 172 are shown. Those skilled in the art understand that the read circuitry can include additional transistors connected in a known way. Those additional transistors, like with the transistors 170 and 172, are supported by the semiconductor layer 156 of the upper semiconductor substrate 112. The pixel of FIG. 3 is of the back-side illuminated type where light is received at the bottom surface of the lower semiconductor substrate 114.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An integrated circuit device, comprising:
    a first semiconductor substrate layer;
    a first transistor formed in and above the first semiconductor substrate layer, said first transistor including a first source-drain formed by a doped region in the first semiconductor substrate layer;
    a second semiconductor substrate layer;
    a second transistor formed in and above the second semiconductor substrate layer, said second transistor including a second source-drain formed by a doped region in the second semiconductor substrate layer;
    wherein the second semiconductor substrate layer is placed above the first semiconductor substrate layer and separated therefrom by an intermediary insulating layer; and
    a first metal wiring extending from an electrical contact with the doped region for the first source-drain, through the intermediary insulating layer and passing through and in electrical contact with the doped region for the second source-drain.

2. The integrated circuit device of claim 1, wherein said doped region in the second semiconductor substrate layer has a thickness that is equal to a thickness of the second semiconductor substrate layer.

3. The integrated circuit device of claim 2, wherein the second semiconductor substrate layer is doped with a p-type dopant and the doped region in the second semiconductor substrate layer is doped with an n-type dopant.

4. The integrated circuit device of claim 1, further comprising:
    a first substrate contact formed by a further doped region in the first semiconductor substrate layer;
    a second substrate contact formed by a further doped region in the second semiconductor substrate layer; and
    a second metal wiring extending from an electrical contact with the further doped region for the first substrate contact, through the intermediary insulating layer and passing through and in electrical contact with the further doped region for the second substrate contact.

5. The integrated circuit device of claim 1, further comprising:
    a third transistor formed in and above the second semiconductor substrate layer, said third transistor including a gate electrode; and
    wherein the first metal wiring further extends to make an electrical contact with the gate electrode of the third transistor.

6. The integrated circuit device of claim 1, wherein said doped region in the second semiconductor substrate layer through which the first metal wiring passes functions to electrically isolate the first metal wiring from the second semiconductor substrate layer by forming a lateral reverse biased p-n junction with the second semiconductor substrate layer.

7. The integrated circuit device of claim 1, further comprising an insulating layer over the second semiconductor substrate layer, wherein the first metal wiring passes completely through the doped region for the second source-drain and passes into the insulating layer over the second semiconductor substrate layer.

8. The integrated circuit device of claim 1, wherein the second source-drain has a thickness equal to a thickness of the second semiconductor substrate layer, and the first metal wiring passes through and is completely surrounded by the second source-drain.

9. An integrated circuit device, comprising:
    a first semiconductor substrate layer;
    a first transistor formed in and above the first semiconductor substrate layer, said first transistor including a first source-drain formed by a doped region in the first semiconductor substrate layer;
    a second semiconductor substrate layer;

a second transistor formed in and above the second semiconductor substrate layer, said second transistor including a second source-drain formed by a doped region in the second semiconductor substrate layer;

wherein the second semiconductor substrate layer is placed above the first semiconductor substrate layer and separated therefrom by an intermediary insulating layer;

a trench isolation formed in second semiconductor substrate layer and having a thickness equal to a thickness of the second semiconductor substrate layer; and a first metal wiring extending from an electrical contact with the doped region for the first source-drain, through the intermediary insulating layer and passing through the trench isolation to make an electrical contact with the doped region for the second source-drain, wherein the first metal wiring is surrounded on all sides by the trench isolation.

10. The integrated circuit device of claim 9, further comprising:

a first substrate contact formed by a further doped region in the first semiconductor substrate layer;

a second substrate contact formed by a further doped region in the second semiconductor substrate layer; and a second metal wiring extending from an electrical contact with the further doped region for the first substrate contact, through the intermediary insulating layer and passing through and in electrical contact with the further doped region for the second substrate contact.

11. An integrated circuit device, comprising:

a first semiconductor substrate layer;

a first transistor formed in and above the first semiconductor substrate layer, said first transistor including a first source-drain formed by a doped region in the first semiconductor substrate layer;

a second semiconductor substrate layer;

a second transistor formed in and above the second semiconductor substrate layer, said second transistor including a second source-drain formed by a doped region in the second semiconductor substrate layer;

wherein the second semiconductor substrate layer is placed above the first semiconductor substrate layer and separated therefrom by an intermediary insulating layer; and a first metal wiring extending from an electrical contact with the doped region for the first source-drain, through the intermediary insulating layer and passing through an electrical isolation structure in the second semiconductor substrate layer to make an electrical contact with the doped region for the second source-drain, said electrical isolation structure having a thickness equal to a thickness of the second semiconductor substrate layer, wherein the first metal wiring is surrounded on all sides by the electrical isolation structure.

12. The integrated circuit of claim 11, wherein said electrical isolation structure is a trench isolation filled with an insulating material, said first metal wiring passing through the trench isolation which insulates the first metal wiring from making electrical contact with the second semiconductor substrate layer.

13. The integrated circuit of claim 11, wherein said electrical isolation structure is said doped region in the second semiconductor substrate layer for the second source-drain, said first metal wiring passing through and in electrical contact with the doped region for the second source-drain.

14. The integrated circuit device of claim 13, wherein the second semiconductor substrate layer is doped with a p-type dopant and the doped region in the second semiconductor substrate layer is doped with an n-type dopant.

15. The integrated circuit device of claim 13, wherein said doped region in the second semiconductor substrate layer through which the first metal wiring passes functions to electrically isolate the first metal wiring from the second semiconductor substrate layer by forming a lateral reverse biased p-n junction with the second semiconductor substrate layer.

16. The integrated circuit device of claim 11, further comprising:

a first substrate contact formed by a further doped region in the first semiconductor substrate layer;

a second substrate contact formed by a further doped region in the second semiconductor substrate layer; and a second metal wiring extending from an electrical contact with the further doped region for the first substrate contact, through the intermediary insulating layer and passing through and in electrical contact with the further doped region for the second substrate contact.

17. The integrated circuit device of claim 11, further comprising:

a third transistor formed in and above the second semiconductor substrate layer, said third transistor including a gate electrode; and wherein the first metal wiring further extends to make an electrical contact with the gate electrode of the third transistor.

* * * * *